(12) United States Patent
Wu et al.

(10) Patent No.: US 11,328,658 B2
(45) Date of Patent: May 10, 2022

(54) STRETCHABLE DISPLAY DEVICE

(71) Applicant: InnoLux Corporation, Miao-Li County (TW)

(72) Inventors: Yuan-Lin Wu, Miao-Li County (TW); Chan-Feng Chiu, Miao-Li County (TW); Kuan-Feng Lee, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 0 days.

(21) Appl. No.: 17/163,525

(22) Filed: Jan. 31, 2021

(65) Prior Publication Data

US 2021/0256900 A1 Aug. 19, 2021

(30) Foreign Application Priority Data

Feb. 14, 2020 (CN) .......................... 202010093342.8

(51) Int. Cl.
*G09G 3/32* (2016.01)
*G09F 9/30* (2006.01)
*G09F 9/33* (2006.01)

(52) U.S. Cl.
CPC .............. *G09G 3/32* (2013.01); *G09F 9/301* (2013.01); *G09F 9/33* (2013.01); *G09G 2380/02* (2013.01)

(58) Field of Classification Search
CPC ...... G09G 3/32; G09G 2380/02; G09F 9/301; G09F 9/33
See application file for complete search history.

(56) References Cited

U.S. PATENT DOCUMENTS

| | | | | |
|---|---|---|---|---|
| 9,391,286 B1 * | 7/2016 | Kwon | ................. | H01L 51/0097 |
| 9,799,708 B2 * | 10/2017 | Hong | ................. | H01L 51/0097 |
| 10,290,622 B2 * | 5/2019 | Li | ........................... | H01L 24/83 |
| 2012/0165759 A1 * | 6/2012 | Rogers | ............... | H01L 23/3192 |
| | | | | 604/264 |

* cited by examiner

*Primary Examiner* — Muhammad N Edun
(74) *Attorney, Agent, or Firm* — Winston Hsu

(57) ABSTRACT

A stretchable display device is disclosed, which is able to be operated with three states of a non-stretched state, a transition state and a stretched state, and the stretchable display device includes a stretchable substrate and a plurality of light emitting units. The plurality of the light emitting units are disposed on the stretchable substrate, and the plurality of the light emitting units are in a mode of ON or in a mode of OFF. The light emitting units being in the mode of ON are in a number of N1 while in the non-stretched state, the light emitting units being in the mode of ON are in a number of N2 while in the transition state, and the light emitting units being in the mode of ON are in a number of N3 while in the stretched state, wherein N3≥N2>N1.

8 Claims, 8 Drawing Sheets

STRETCHABLE DISPLAY DEVICE

BACKGROUND OF THE DISCLOSURE

1. Field of the Disclosure

The present disclosure relates to a display device, and more particularly to a stretchable display device.

2. Description of the Prior Art

In recent years, display devices have become more and more important in various electronic applications, such as smart phones, tablets, notebook computers, e-book readers and wearable devices (e.g., smart watches). Electronic manufacturers keeps on researching and developing new type display devices. Among these devices, the image quality of stretchable display devices may become poor after stretching, so that manufacturers still need to keeps on researching and developing for manufacturing stretchable display devices with maintained stable display performance.

SUMMARY OF THE DISCLOSURE

Some embodiments of the present disclosure provide a stretchable display device, which is able to be operated with three states of a non-stretched state, a transition state and a stretched state. The stretchable display device includes a stretchable substrate and a plurality of light emitting units. The plurality of the light emitting units are disposed on the stretchable substrate, and the plurality of the light emitting units can be in a mode of ON or in a mode of OFF. The light emitting units being in the mode of ON are in a number of N1 while in the non-stretched state, the light emitting units being in the mode of ON are in a number of N2 while in the transition state, and the light emitting units being in the mode of ON are in a number of N3 while in the stretched state, wherein N3≥N2>N1.

According to the stretchable display device of some embodiments of the present disclosure, since the number of the light emitting units in the mode of ON changes in the non-stretched state, the transition state and the stretched state, the image quality during the stretching process may be improved. In another aspect, according to the present disclosure, the sense of difference of the stretched image may be minor by controlling the number of light emitting units in the mode of ON.

These and other objectives of the present disclosure will no doubt become obvious to those of ordinary skill in the art after reading the following detailed description of the embodiment that is illustrated in the various figures and drawings.

DETAILED DESCRIPTION

The present disclosure may be understood by reference to the following detailed description, taken in conjunction with the drawings as described below. It is noted that, for purposes of illustrative clarity and being easily understood by the readers, various drawings of this disclosure show a portion of the device, and certain elements in various drawings may not be drawn to scale. In addition, the number and dimension of each element shown in drawings are only illustrative and are not intended to limit the scope of the present disclosure.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". When the terms "include", "comprise" and/or "have" are used in the description of the present disclosure, the corresponding features, regions, steps, operations and/or components would be pointed to existence, but not limited to the existence or addition of one or more corresponding features, regions, steps, operations, components and/or combinations thereof. When a component is referred to as being "on" or "connected to" another component, it may be directly on or directly connected to the other component, or intervening components may be presented (indirect condition). In contrast, when a component is referred to as being "directly on" or "directly connected to" another component, there are no intervening components presented.

The terms "about", "substantially", "equal", or "same" generally mean within 20% of a given value or range, or mean within 10%, 5%, 3%, 2%, 1%, or 0.5% of a given value or range.

In the present disclosure, "stretched/stretchable" means that when external pressure and/or external force is applied to an object, the object may be deformed, and this deformation may include the variation in the area, length, width and/or curvature of the object in any direction(s), but not limited herein. For example, the increase or decrease in the length of an object may be "stretched/stretchable" according to the present disclosure.

It should be noted that the technical features in different embodiments described in the following can be replaced, recombined, or mixed with one another to constitute another embodiment without departing from the spirit of the present disclosure.

Figure 1:
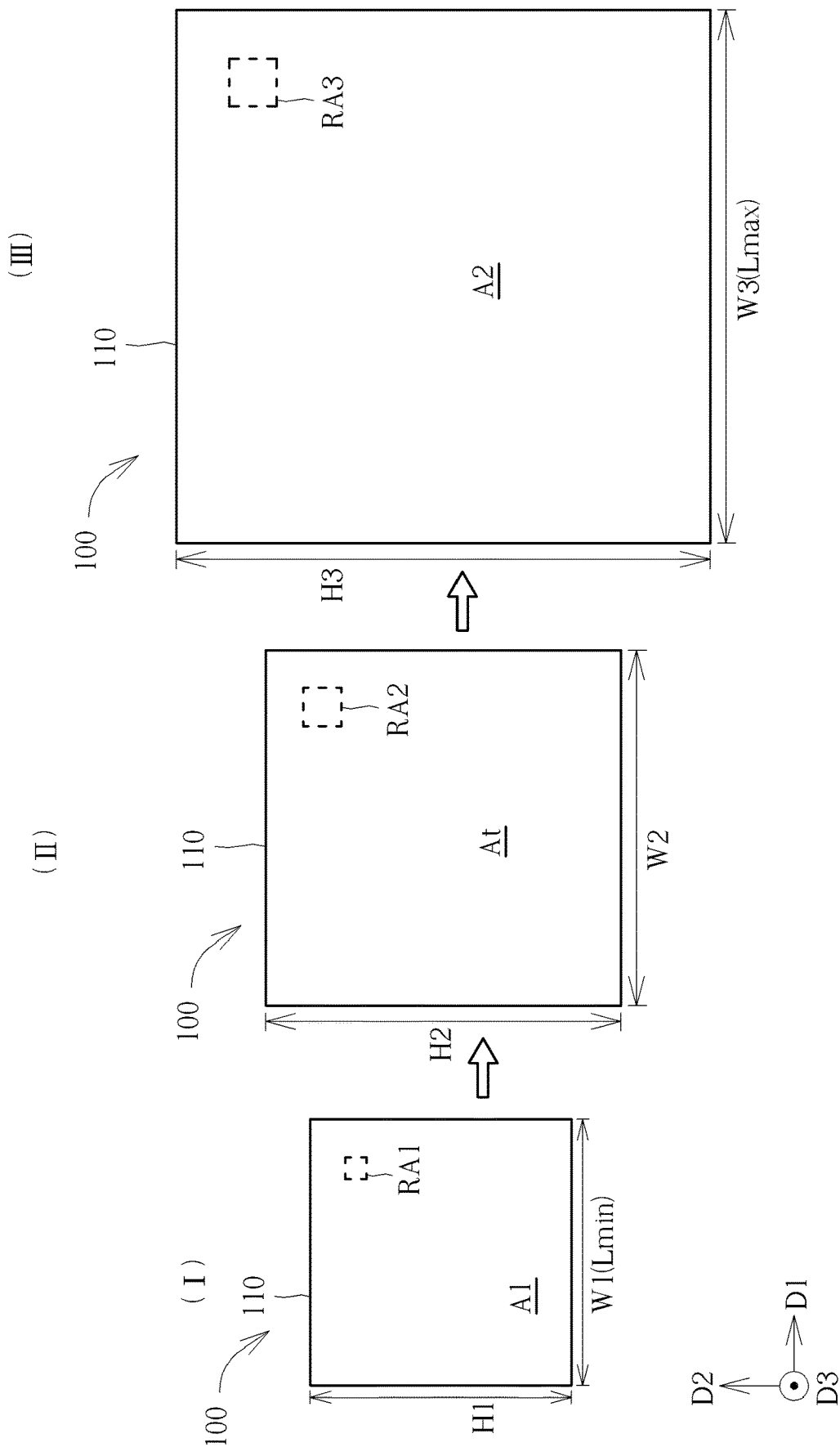
FIG. 1 is a schematic diagram of the operation of a stretchable display device according to the present disclosure.
Figure 2:
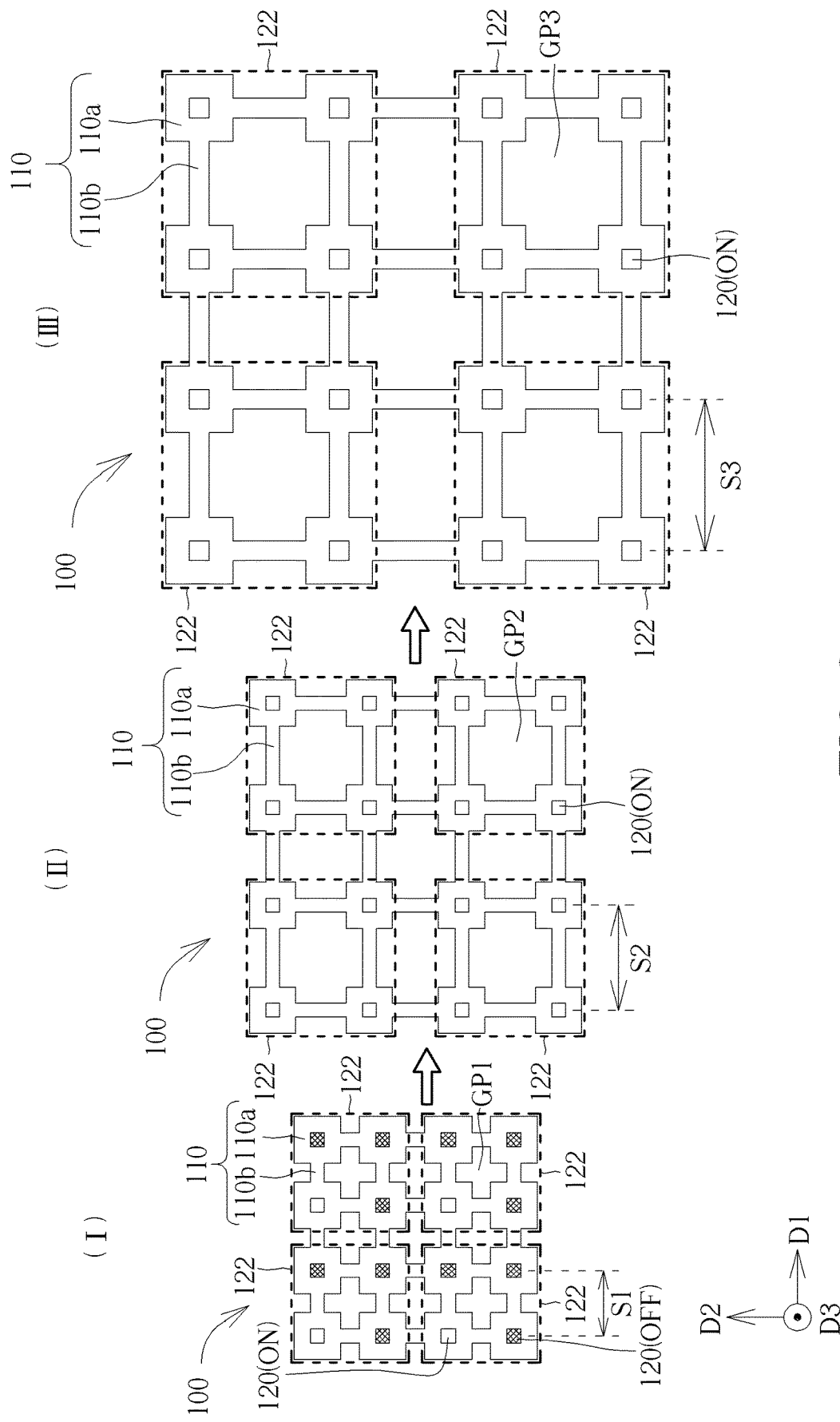
FIG. 2 is a partial enlargement top-view schematic diagram of a stretchable display device in various states according to a first embodiment of the present disclosure.

Please refer to FIG. 1 and FIG. 2. FIG. 1 is a schematic diagram of the operation of a stretchable display device according to the present disclosure. FIG. 2 is a partial enlargement top-view schematic diagram of a stretchable display device in various states according to a first embodiment of the present disclosure. As shown in FIG. 1, in the present disclosure, the stretchable display device 100 is able to be operated with three states of a non-stretched state I, a transition state II and a stretched state III. The non-stretched state I is a state that the stretchable display device 100 is not stretched, the stretched state III is a state after the stretchable display device 100 is stretched, and the transition state II is a state between the non-stretched state I and the stretched state III during the stretching process.

The stretchable display device 100 may be stretched along one direction or various directions (e.g., but not limited to one direction, two directions or three-dimensional directions). The stretchable display device 100 may be stretched from the non-stretched state I to the stretched state III through the transition state II, so that the dimension of the stretchable display device 100 in at least one direction may be changed after stretching. FIG. 1 is an example that the stretchable display device 100 may be stretched along a first direction D1 and a second direction D2. In the non-stretched state I, the stretchable display device 100 may have a width W1 in the first direction D1 and a length H1 in the second direction D2. When the stretchable display device 100 is being stretched, the stretchable display device 100 may go through the transition state II firstly, and at this time the width W2 and the length H2 of the stretchable display device 100 may be stretched and increased continuously. Until the stretchable display device 100 enters the stretched state III, the stretchable display device 100 may have the stretched width W3 and length H3. In some embodiments, the width relationship is W1<W2<W3, and the length relationship is H1<H2<H3, but not limited herein. For example, in other embodiments, W2 may be equal to W3. In still other embodiments, H2 may be equal to H3. It should be noted that the width W2 and the length H2 may not be a single value or a constant respectively. Since the stretchable display device 100 may be continuously stretched in the transition state II, the width W2 and the length H2 may have a specific range respectively. In addition, the stretchable display device 100 of the present disclosure is not limited to being stretched in a plane along the first direction D1 and/or the second direction D2, but may further be stretched in a third direction D3 perpendicular to the D1-D2 plane, so the stretched stretchable display device 100 may further form a curved display device, with a protrudent shape for instance, wherein a pixel compensation may be provided according to the present disclosure.

Please refer to FIG. 2. FIG. 2 is a partial enlargement top-view schematic diagram of a stretchable display device in various states according to the first embodiment of the present disclosure, wherein the partially enlarged portions in the non-stretched state I, the transition state II and the stretched state III may, for example, respectively correspond to the portion RA1, portion RA2 and portion RA3 in FIG. 1, but not limited herein. The stretchable display device includes a stretchable substrate 110 and a plurality of light emitting units 120, wherein the light emitting units 120 are disposed on the stretchable substrate 110. The light emitting units 120 may be in a mode of ON (also referred to as an ON mode) or in a mode of OFF (also referred to as an OFF mode) respectively. The ON mode may indicate that the light emitting unit 120 receives signals and thus operates (e.g., generates light), and the OFF mode may indicate that the light emitting unit 120 does not receive signals and thus does not operate (e.g., does not generate light), but not limited herein.

In some embodiments, the ON mode may indicate that the light emitting unit 120 receives signals and the gray scale is greater than a low gray scale (e.g., the low gray scale means that the light intensity is less than 20% of the light intensity of the highest gray scale image), and the OFF mode may indicate that the light emitting unit 120 receives signals and the gray scale is less than or equal to the low gray scale. For example, the gray-scale measurement method may include measuring the light intensity of the output light emitted by the light emitting units 120 in the gray scale image with a spectrometer, and then comparing the measured light intensity with the light intensity of the highest gray scale of the same display device to confirm the gray scale, wherein the output light that is measured indicates the final exiting light of the display device, which can be observable by the user. The light intensity of the gray scale image may be obtained by measuring the same number of light emitting units 120.

For instance, one light emitting unit 120 may represent one pixel, and one pixel may include a plurality of sub-pixels, for example, including a red sub-pixel, a green sub-pixel and a blue sub-pixel, or including a red sub-pixel, a green sub-pixel, a blue sub-pixel and a white sub-pixel, but not limited herein. In some embodiments, one light emitting unit 120 may also represent one sub-pixel.

The stretchable substrate 110 may include a plurality of material layers or films. For example, the stretchable substrate 110 may include a substrate and an optional buffer layer. The substrate may include polymer materials, such as polyimide (PI), polyethylene terephthalate (PET), any combinations of the materials mentioned above, or any other suitable materials, such as elastic materials or stretchable materials. The stretchable substrate 110 may include pixel parts 110a and connecting parts 110b. The pixel parts 110a are used for disposing the light emitting units 120, and the adjacent pixel parts 110a are spaced apart from each other. The connecting parts 110b are disposed between the adjacent pixel parts 110a and connected to two adjacent pixel parts 110a, so that a pitch exists between the adjacent pixel parts 110a, e.g., a pitch S1 in the non-stretched state I. A gap may be formed between the adjacent pixel parts 110a and the connecting parts 110b, e.g., a gap GP1 in the non-stretched state I. The gap in FIG. 2 may have a cross-like shape, but not limited herein, and the gap may further have other shapes. When the stretchable display device 100 is stretched from the non-stretched state I to the stretched state III, the stretchable substrate 110 may be stretched together, so that the length of the connecting part 110b may increase and the pitch between adjacent pixel parts 110a may enlarge to become a pitch S3, and the gap may also increase accordingly. For example, the gap GP2 and the pitch S2 between adjacent pixel parts 110a in the transition state II may be respectively greater than the gap GP1 and the pitch S1 in the non-stretched state I, and the gap GP3 and the pitch S3 in the stretched state III may be greater than the gap GP2 and the pitch S2 in the transition state II. In the embodiment shown in FIG. 2, the dimension of the pixel parts 110a does not increase with stretching during the stretching process, but in some embodiments, the dimension of the pixel parts 110a may also change during the stretching process. Each of the light emitting units 120 may be respectively disposed on a surface of a pixel part 110a, but the present disclosure is not limited herein, and the number of the light emitting units 120 disposed on a pixel part 110a may be multiple.

According to the present disclosure, when the stretchable display device 100 is in the non-stretched state I, only a portion of the plurality of the light emitting units 120 are in the mode of ON (shown by the square frames without shading in FIG. 2). For example, in the non-stretched state I, the plurality of the light emitting units 120 in the ON mode are in a number of N1. In contrast, in the non-stretched state I, another portion of the plurality of the light emitting units 120 are in the OFF mode (shown by the square frames with cross-diagonal shading in FIG. 2). During the stretching process, that is, when the stretchable display device 100 is in the transition state II, the assisting light emitting units 120 may switch from the OFF mode to the ON mode. That is to say, the number of the light emitting units 120 in the ON mode may begin to change, so that the plurality of the light emitting units 120 in the ON mode are in a number of N2, and the number N2 is greater than the number N1. After stretching, when the stretchable display device 100 is in the stretched state III, the plurality of the light emitting units 120 in the ON mode are in a number of N3, wherein the number N3 is greater than or equal to the number N2, and the number N3 may be equal to or less than the total number of the light emitting units 120 on the stretchable substrate 110. That is to say, when the stretchable display device 100 enters the stretched state III, for example (but not limited to), all of the light emitting units 120 may be in the ON mode, alternatively, a portion of the light emitting units 120 may still be in the OFF mode in some other embodiments. From the above description, the relationship between the number of the light emitting units 120 turned on in different states is N3≥N2>N1. According to the present disclosure, by changing the assisting lighting emitting units 120 from the OFF mode to the ON mode, the image quality before and after stretching may be improved or maintained.

Please refer to FIG. 1 and FIG. 2. When the stretchable display device 100 is in the non-stretched state I, the stretchable substrate 110 has a first area A1, and a number N1 of light emitting units 120 are in the ON mode, while the other light emitting units 120 are in the OFF mode. In the present disclosure, a number of the light emitting units 120 being in the ON mode per unit area of the stretchable substrate 100 that is non-stretched is defined as a first turned-on number of light emitting units per unit area PPA_1 (i.e., the stretchable display device 100 has a PPA_1 that is defined as a number of light emitting units 120 being in the mode of ON per unit area of the stretchable substrate 110 while in the non-stretched state I, and PPA_1=N1/A1). In the transition state II while stretching, the stretchable substrate 110 may have a transition area At. After stretching, when the stretchable display device 100 is in the stretched state III, the stretchable substrate 110 has a second area A2. In this embodiment, for example, the first area A1 is less than the transition area At, and the transition area At is less than the second area A2, but not limited herein. Compared with the non-stretched state I, the assisting light emitting units 120 may change from the OFF mode to the ON mode in the stretched state III, and at this time, a number N3 of light emitting units 120 are in the ON mode. In the present disclosure, a number of the light emitting units 120 being in the ON mode per unit area of the stretchable substrate 110 that is stretched is defined as a second turned-on number of light emitting units per unit area PPA_2 (i.e., the stretchable display device 100 has a PPA_2 that is defined as a number of light emitting units 120 being in the mode of ON per unit area of the stretchable substrate 110 while in the stretched state III, and PPA_2=N3/A2), wherein the second area A2 is different from the first area A1. As described above, the second area A2 is greater than the first area A1, but not limited herein. According to some embodiments of the present disclosure, the stretchable display device 100 may be designed as making the second turned-on number of light emitting units per unit area PPA_2 be substantially equal to (or greater than or equal to) the first turned-on number of light emitting units per unit area PPA_1, so that the image quality in the stretched state III may not be worse than the image quality in the non-stretched state I, but the present disclosure is not limited herein. According to some embodiments, a turned-on number of light emitting units per unit area PPA before and after stretching may be appropriately controlled. For example, 1.5×PPA_1≥PPA_2≥0.5×PPA_1, thus, the image quality before and after stretching may be maintained. According to some embodiments, when stretching in one-dimensional direction, a turned-on number of light emitting units per unit length PPI before and after stretching may be appropriately controlled, for example, 1.5×PPI_1≥PPI_2≥0.5×PPI_1, so that the difference in resolution per unit area (or PPI) before and after stretching may not be too great, and the image quality before and after stretching may be maintained.

According to the present disclosure, among the plurality of the light emitting units 120, a light emitting group may be formed of light emitting units 120 with a number of Q. For example (but not limited to), a light emitting group may be composed of a number of two, three or four light emitting units 120, so as to form a plurality of light emitting groups 122. According to some embodiments of the present disclosure, the ratio of the second area A2 of the stretchable substrate 110 in the stretched state III to the first area A1 of the stretchable substrate 110 in the non-stretched state I is defined as a ratio M (i.e., A2/A1), and the ratio M is less than or equal to Q (i.e., M≤Q), that is, the multiple of the second area A2 to the first area A1 may be less than or equal to the number of the light emitting units 120 in one light emitting group 122. Through the above design, the second turned-on number of light emitting units per unit area PPA_2 may be greater than or equal to the first turned-on number of light emitting units per unit area PPA_1, so that at least the same value of the turned-on number of light emitting units per unit area PPA may be maintained before and after stretching, and the image quality may not be greatly affected due to stretching. For example, the brightness per unit area may be maintained. This design will be illustrated in detail in following examples.

Please refer to FIG. 2. In some embodiments, the stretchable display device 100 includes a plurality of light emitting units 120, wherein four light emitting units 120 form a group to form a plurality of light emitting groups 122 (i.e., the number Q described above is 4). When the stretchable display device 100 is in the non-stretched state I, the stretchable substrate 110 has a first area A1, and in each of the light emitting groups 122, one light emitting unit 120 is in the ON mode while the other three light emitting units 120 are in the OFF mode. Thus, the first turned-on number of light emitting units per unit area PPA_1 may be obtained (four light emitting units divided by one time the area: 4/1=4). When the stretchable substrate 110 is stretched to twice the length along the horizontal first direction D1 and the vertical second direction D2 respectively, the stretchable display device 100 becomes to be in the stretched state III, and the stretchable substrate 110 has a second area A2, wherein the second area A2 is four times the first area A1, and in each of the light emitting groups 122, the three light emitting units 120 that were originally in the OFF mode become to be in the ON mode, that is, the four light emitting units 120 are all in the ON mode. Thus, the second turned-on number of light emitting units per unit area PPA_2 may be obtained (sixteen light emitting units divided by four times the area: 16/4=4). According to the change of area and the change of the number of the light emitting units 120 in the ON mode before and after stretching, it can be understood that the second turned-on number of light emitting units per unit area PPA_2 is equal to the first turned-on number of light emitting units per unit area PPA_1, that is, the brightness per unit area is nearly unchanged. However, if the ratio of the second area A2 to the first area A1 is greater than the number Q of the light emitting units 120 forming a light emitting group 122, that is, if (A2/A1)>4, the second turned-on number of light emitting units per unit area PPA_2 may be less than the first turned-on number of light emitting units per unit area PPA_1. Therefore, when four light emitting units 120 form a group of the light emitting groups 122, the ratio of the second area A2 in the stretched state III to the first area A1 in the non-stretched state I may be designed as being less than or equal to 4, that is, (A2/A1)≤4 (i.e., M≤Q), such that at least identical number of turned-on light emitting units per unit area may be maintained before and after stretching, as mentioned in the previous paragraph.

According to some embodiments, during the stretching process, the stretchable display device 100 has a transition state II between the non-stretched state I and the stretched state III, so the light emitting units 120 that were originally in the OFF mode may be all turned on or partially turned on in the transition state II. For example, the light emitting units 120 may switch to be in the ON mode in succession before entering the stretched state III, and when the stretchable display device 100 enters the stretched state III, all of the light emitting units 120 become to be in the ON mode, but not limited herein.

As the description above, the number (N3) of the light emitting units in the ON mode while the stretchable display device is in the stretched state is greater than the number (N1) of the light emitting units in the ON mode while the stretchable display device is in the non-stretched state. According to some embodiments, a suitable threshold dimension may be designed to determine a suitable time point for increasing the number of the light emitting units in the ON mode or a suitable time for turning on further light emitting units. As shown in FIG. 1, the stretchable display device 100 may be stretched along a direction, e.g. along the first direction D1. While in the non-stretched state I, the dimension of the stretchable display device 100 in this direction is defined as a minimum dimension Lmin, such as a width W1. In the stretched state III, the dimension of the stretchable display device 100 in this direction is defined as a maximum dimension Lmax, such as a width W3. When the dimension of the stretchable display device 100 in this direction is less than a threshold dimension Lc1 (for example, when the dimension is the width W1), the number of the light emitting units in the ON mode is Y1, such as N1. The threshold dimension Lc1 is greater than the minimum dimension Lmin and less than the maximum dimension Lmax, that is, Lmin<Lc1<Lmax. When the dimension of the stretchable display device 100 in this direction is greater than or equal to the threshold dimension Lc1 (for example, when the dimension is the width W2), the number of the light emitting units in the ON mode is N2, wherein N2 is greater than N1. In detail, the dimension of the stretchable display device 100 in this direction may be the length or the width of the stretchable substrate 110 in this direction.

Figure 3:
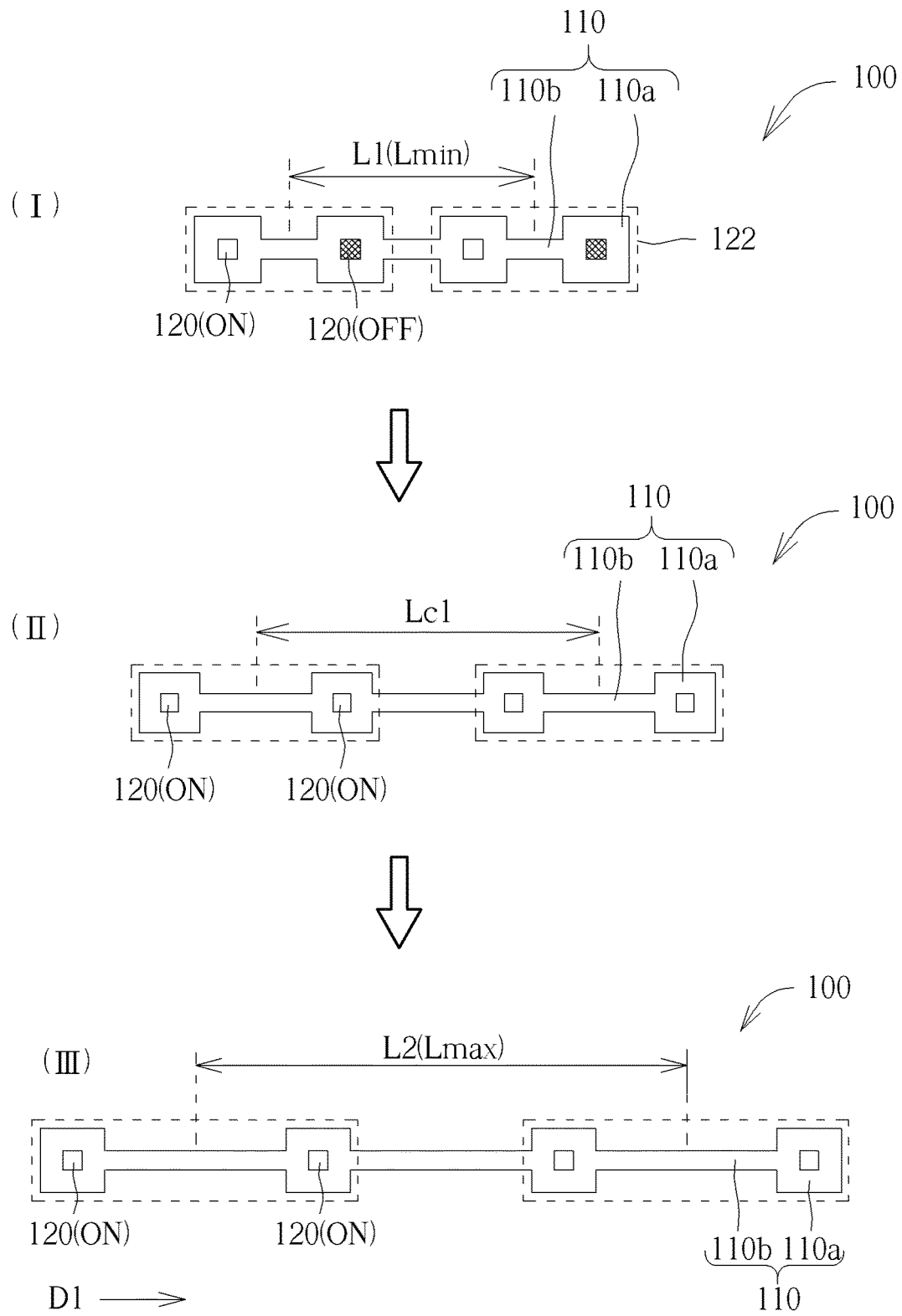
FIG. 3 is a partial enlargement schematic diagram of a stretchable display device in various states according to a second embodiment of the present disclosure.

Please refer to FIG. 3. FIG. 3 is a partial enlargement schematic diagram of a stretchable display device in various states according to a second embodiment of the present disclosure. FIG. 3 illustrates that the stretchable display device 100 may be stretched in a single direction (e.g. the first direction D1) as an example. In the following third embodiment and fourth embodiment, the stretchable display device 100 is also stretched in a single direction as an example, and will not be redundantly described, but the present disclosure is not limited herein. The suitable number and suitable time for turning on the light emitting units 120 and related descriptions in FIG. 3 and other embodiments may be modified and changed by those skilled in the art according to the disclosure and experience, so as to obtain the design of the stretchable display device 100 when stretching in multiple directions.

According to some embodiments of the present disclosure, according to the relationship between the dimension of the stretchable display device 100 in the direction and a threshold dimension, a suitable time for increasing the number of the light emitting units in the ON mode may be determined through the suitable threshold dimension. The dimension of the stretchable display device 100 in one direction may be a pitch of two adjacent light emitting groups 122 in the direction.

For example, referring to FIG. 3, the stretchable display device 100 includes a plurality of light emitting units 120, wherein a number Q (such as Q=2) of light emitting units 120 form a group to form a plurality of light emitting groups 122. When the stretchable display device 100 is in the non-stretched state I, a pitch between adjacent light emitting groups 122 is defined as a first dimension L1, and one light emitting unit 120 is in the ON mode and another one light emitting unit 120 is in the OFF mode in each of the light emitting groups 122. For example, in each of the light emitting groups 122, the left light emitting unit 120 is in the ON mode, but not limited herein. In different embodiments, the right light emitting unit 120 in each of the light emitting groups 122 may be turned on, or the light emitting units 120 in the ON mode in different light emitting groups 122 may be in different positions, in other words, the positions of the turned-on light emitting units 120 may not be completely the same. As shown in FIG. 3, when the stretchable substrate 110 is stretched along the horizontal first direction D1, the stretchable display device 100 may go through the transition state II firstly. Furthermore, when the stretchable substrate 110 is stretched to twice the length, the stretchable display device 100 may enter the stretched state III. At this time, the pitch between the two adjacent light emitting groups 122 becomes a second dimension L2, and the light emitting unit 120 that was originally in the OFF mode has changed to be in the ON mode, that is, both of the light emitting units 120 are in the ON mode in each light emitting group 122. The transition state II shown in FIG. 3 may represent the turned-on time point of the second light-emitting unit 120 in the light emitting group 122. In other words, when the stretchable substrate 110 is stretched until the pitch between two adjacent light emitting groups 122 is the threshold dimension Lc1, the number of light emitting units 120 in the ON mode starts to change, that is, the assisting light emitting units 120 begin to change from the OFF mode to the ON mode, so that the number of light emitting units 120 in the ON mode in each of the light emitting groups 122 changes from one to two.

Figure 4:
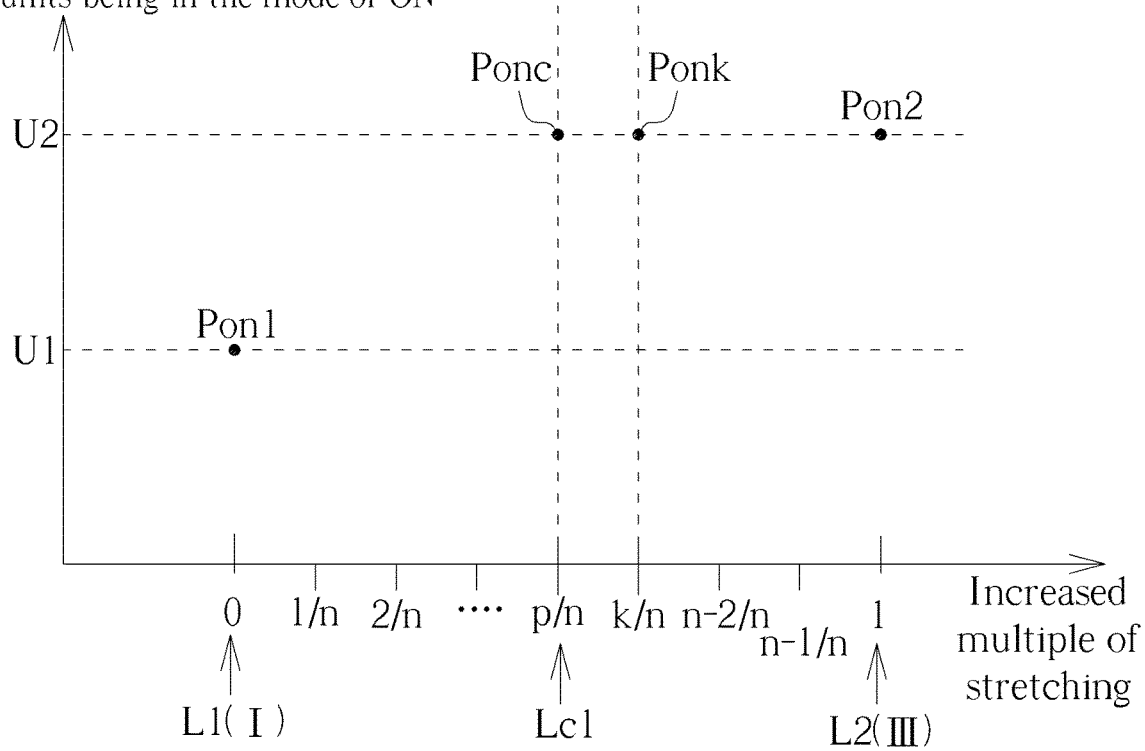
FIG. 4 and FIG. 5 are schematic diagrams of the relationship between the number of light emitting units being in the mode of ON and the increased multiple of stretching in the light emitting group according to the second embodiment of the present disclosure.
Figure 5:
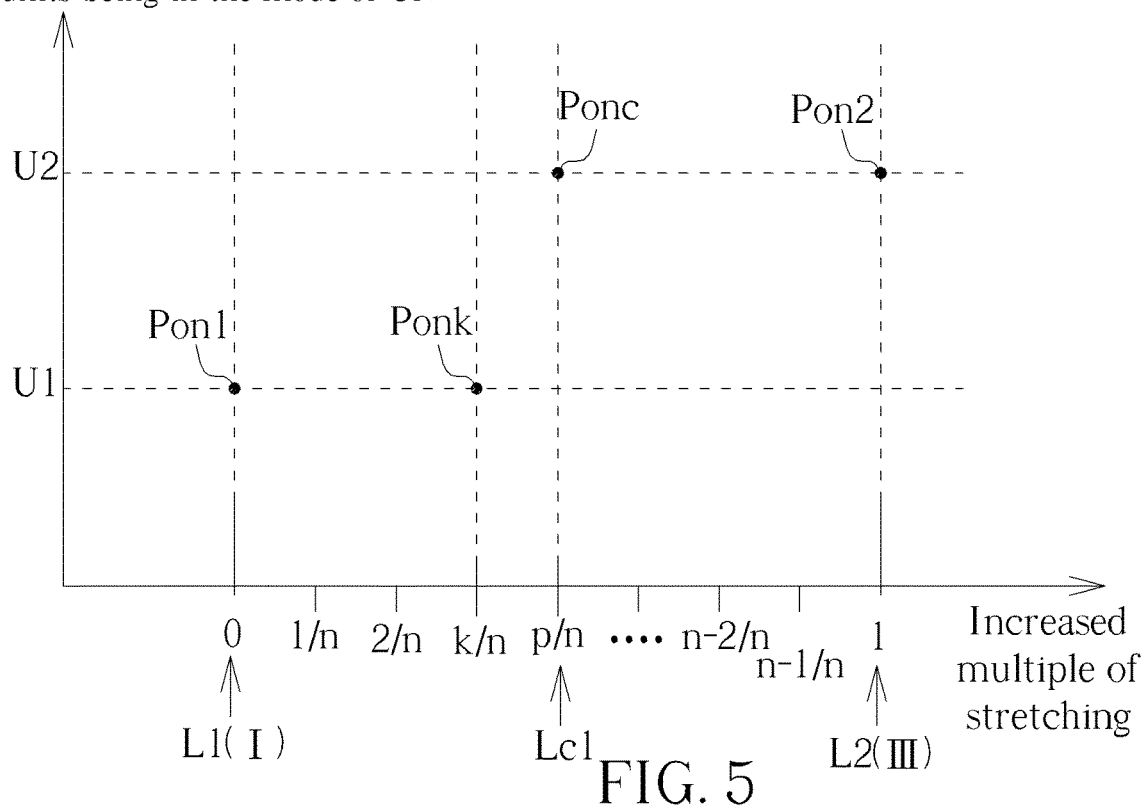

The design of the threshold dimension will be discussed below. Please refer to FIG. 4 and FIG. 5 accompanied with FIG. 3, wherein FIG. 4 and FIG. 5 are schematic diagrams of the relationship between the number of light emitting units being in the ON mode and the stretching dimension in the light emitting group according to the second embodiment of the present disclosure. FIG. 4 and FIG. 5 respectively show different conditions in the stretching process, wherein the stretching dimension refers to the pitch between adjacent light emitting groups 122 in the first direction D1 as an example, but not limited herein. The stretching dimension in the embodiments of the present disclosure refers to the dimension of the stretchable display device 100. In different embodiments of the present disclosure, the "dimension of the stretchable display device" may refer to a dimension in one direction, or a dimension in more than one direction. For example, the dimension of the stretchable display device may be the dimension of the light emitting group, the pitch between two adjacent light emitting groups, the length or width of the stretchable substrate, or the area of the stretchable substrate, but not limited herein.

Please refer to FIG. 3, FIG. 4 and FIG. 5. When the stretchable display device 100 is in the non-stretched state I, the pitch between adjacent light emitting groups 122 (referred as the stretching dimension below) is a first dimension L1, and the number of the light emitting units in the ON mode in each of the light emitting groups 122 is U1, as shown by the point Pon1, wherein U1 is 1 for example, but not limited herein. When the stretchable substrate 110 is stretched along the horizontal first direction D1 to have a second dimension L2, the stretchable display device 100 becomes the stretched state III, and the number of the light emitting units in the ON mode in each of the light emitting groups 122 is U2, as shown by the point Pon2, wherein U2 is 2 for example, but not limited herein. In the embodiment shown in FIG. 3, the second dimension L2 is twice the first dimension L1 as an example, but not limited herein. The transition state II between the non-stretched state I and the stretched state III represents that the stretching dimension of the stretchable substrate 110 is greater than the first dimension L1 and less than the second dimension L2. Furthermore, in the transition state II, when the stretchable substrate 110 is stretched to reach the threshold dimension Lc1, the assisting light emitting units 120 may start to change from the OFF mode to the ON mode. In other words, the number of the light emitting units 120 in the ON mode is U2 in one light emitting group 122, as shown by the point Ponc.

As shown in FIG. 4 and FIG. 5, the horizontal axis is the increased multiple of stretching, and the vertical axis is the number of the light emitting units 120 turned on in one light emitting group 122. In the horizontal axis, the position symbolized with "0" represents the increased multiple of dimension of the stretchable substrate 110 in the non-stretched state I, and at this time, the stretchable substrate 110 has not been stretched to increase its dimension, so the increased multiple of stretching is 0. In other words, the stretching dimension of the stretchable substrate 110 is the first dimension L1 in the non-stretched state I. The position symbolized with "1" represents the increased multiple of dimension of the stretchable substrate 110 in the stretched state III, wherein the dimension of the stretchable substrate 110 is doubled, that is, the dimension of the stretchable substrate 110 becomes the second dimension L2. The position symbolized as 1/n represents that the length is increased by 1/n times, that is, the dimension of (1/n)×L1 is increased. The position symbolized with n−1/n represents that the length is increased by n−1/n times, that is, the dimension of (n×1/n)×L1 is increased. In other words, the minimum unit of the increased multiple of stretching is set as 1/n (i.e., the dimension increased by stretching is (1/n)×L1), wherein "n" is an extremely large number. That is to say, assumed that between the first dimension L1 in the non-stretched state I (being stretched zero times) and the second dimension L2 in the stretched state III (after being stretched doubled), it is divided into "n" equal parts, and "1/n" represents that a length of 1/n times the first dimension L1 is increased, but the present disclosure is not limited herein. As described above, when the increased multiple of stretching is k/n, the slope SL is calculated as $$PPI_{\frac{k}{n}} - PPI_{\frac{k-1}{n}}.$$

Furthermore, when the increased multiple of stretching is p/n and the stretchable substrate 110 has the threshold dimension Lc1, the assisting light emitting units 120 may change from the OFF mode to the ON mode, such that the number of the light emitting units 120 in the ON mode in each of the light emitting groups 122 may change from one (U1) to two (U2). Therefore, if a number of the light emitting units 120 being in the ON mode per unit length is defined as "a turned-on number of light emitting units per unit length PPI", the calculation method of the turned-on number of light emitting units per unit length PPI and the slope SL may can be divided into two conditions when the increased multiple of stretching is k/n:

(1) As shown in FIG. 4, when p≤k, two light emitting units 120 are in the ON mode in each of the light emitting groups 122, e.g., the point Ponk. Therefore, the turned-on number of light emitting units per unit length is $$PPI_{\frac{k}{n}} = \frac{2}{1+\frac{k}{n}} = \frac{2 \times n}{n+k},$$

and the slope is $$SL_{\frac{k}{n}} = PPI_{\frac{k}{n}} - PPI_{\frac{k-1}{n}} = \frac{2 \times n}{n+k} - \frac{2 \times n}{n+k-1}.$$

(2) As shown in FIG. 5, when p>k, one light emitting unit 120 is in the ON mode and another light emitting unit 120 is in the OFF mode in each of the light emitting groups 122, e.g., the point Ponk. The turned-on number of light emitting units per unit length is $$PPI_{\frac{k}{n}} = \frac{1}{1+\frac{k}{n}} = \frac{n}{n+k},$$

and the slope is $$SL_{\frac{k}{n}} = PPI_{\frac{k}{n}} - PPI_{\frac{k-1}{n}} = \frac{n}{n+k} - \frac{n}{n+k-1}.$$

Since the condition that p=k occurs only once in the stretching process and "n" is a extremely large number, the influence is very small and neglectable. When the p value is smaller, the number of occurrences of the condition (1) is greater, the number of occurrences of the condition (2) is smaller, and the slope in the condition (1) is twice the slope in the condition (2). Thus, when the p value is smaller, the variation in the slope of the curve is greater (e.g., the value that the slope of each point on the curve (of the turned-on number of light emitting units per unit length PPI to the stretching dimension, PPI-dimension curve) are squared and then summed is greater), such that the sense of difference of the stretching image are greater. Therefore, in the stretching process, the earlier the time point at which the number of the light emitting units 120 in the ON mode starts to change, the greater the sense of difference of the stretching image. From the above description, the p value should not be too small, for example, should not be extremely close to the first size L1.

In some embodiments, as shown in FIG. 3 and FIG. 4, the first dimension L1 may be a minimum dimension Lmin of the stretchable display device 100 (or the stretchable substrate 110) in the first direction D1 (the dimension herein is the length as an example, not redundantly described), and the second dimension L2 may be a maximum dimension Lmax of the stretchable display device 100 (or the stretchable substrate 110) in the first direction D1. When the dimension of the stretchable display device 100 in the first direction D1 is less than the threshold dimension Lc1, the number of the light emitting units 120 in the ON mode in one light emitting group is U1, and when the dimension of the stretchable display device 100 in the first direction D1 is greater than or equal to the threshold dimension Lc1, the number of the light emitting units 120 in the ON mode in one light emitting group is U2, wherein the number U2 is greater than the number U1, both of the number U2 and the number U1 are positive integers, and the threshold dimension Lc1 is greater than the minimum dimension Lmin and less than the maximum dimension Lmax. In some embodiments, the number U2 is the number of all light emitting units 120 in one light emitting group 122. In some embodiments, the number U2 is less than the total number of the light emitting units 120 in one light emitting group 122. In some embodiments, when the stretchable display device 100 has the maximum dimension Lmax in the first direction D1, all of the light emitting units 120 in one light emitting group 122 are in the ON mode. In some embodiments, the threshold dimension Lc1 is in a range from (Lmin+Lmax)/3 to (Lmin+Lmax)/2, that is, (Lmin+Lmax)/3≤Lc1≤(Lmin+Lmax)/2, but not limited herein.

Figure 6:
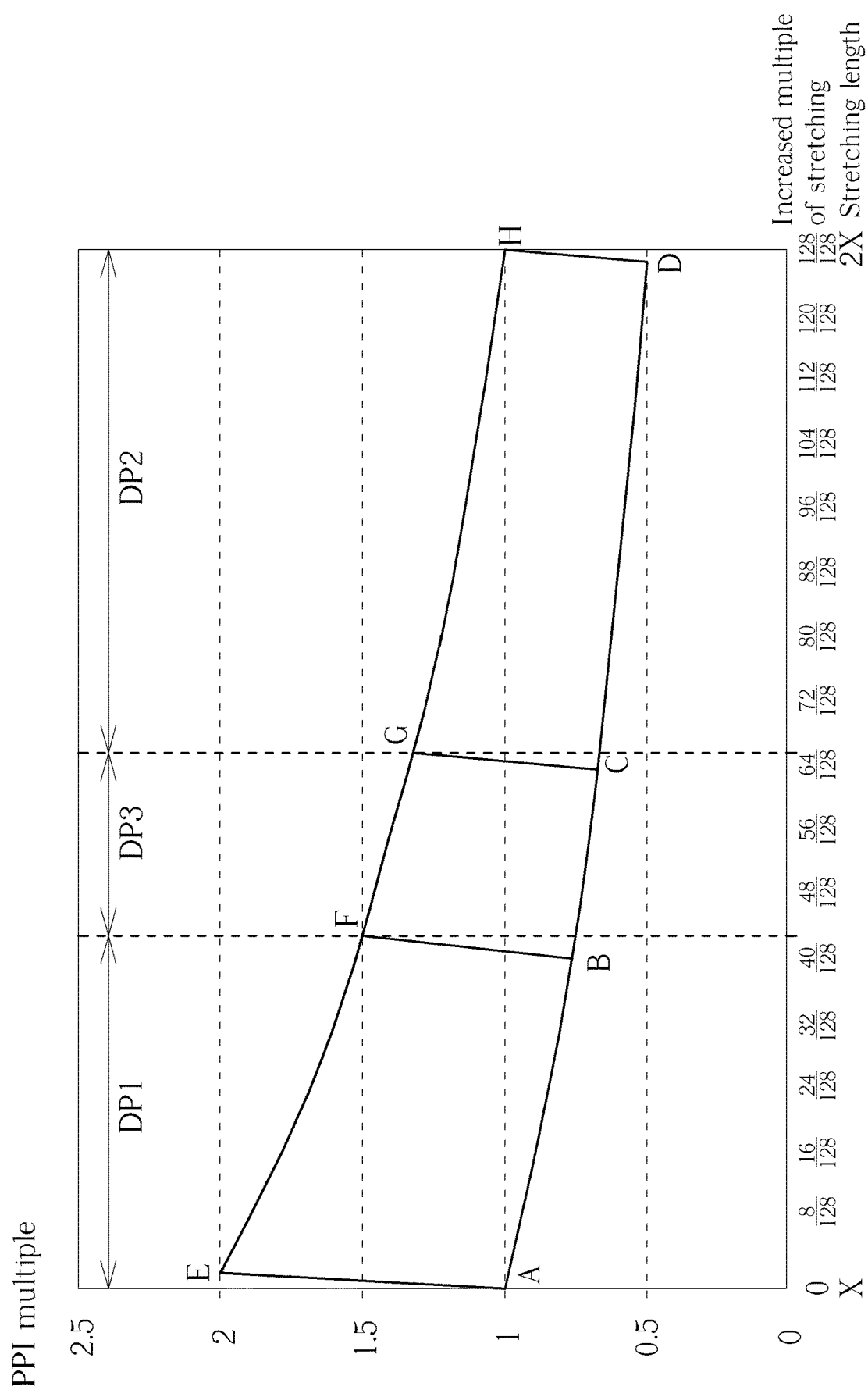
FIG. 6 is a schematic diagrams of the relationship between the PPI multiple and the increased multiple of stretching according to a third embodiment of the present disclosure.

Please refer to FIG. 6. FIG. 6 is a schematic diagrams of the relationship between the PPI multiple and the increased multiple of stretching according to a third embodiment of the present disclosure. In FIG. 6, the stretching dimension (stretching length) from X to 2X is divided into 128 units, and simulating is performed by increasing the dimension by X/128 every time to obtain data. For example, one light emitting group includes two light emitting units. The "0" in the horizontal axis represents that the increased multiple of stretching is zero, that is, the length without stretching is X, the scale "128/128" represents that the one time of the length is increased (i.e., the increased multiple of stretching is 1, or the length is doubled) and the length is 2X, and the scale "64" represents that it is stretched to increase the dimension (length) of 64X/128, that is, it is stretched to increase 0.5*X. In the state that the length is equal to X, when the number of light emitting units 120 in the on mode in the light emitting group 122 is set to 1, the turned-on number of light emitting units per unit length PPI is 1/X, and the PPI multiple is defined as 1, as shown at point A in FIG. 6.

In the stretching process, if no assisting light emitting unit 120 changes from the OFF mode to the ON mode, the turned-on number of light emitting units per unit length PPI may decrease continuously as the stretching length increases. For example, when the increased multiple of stretching is 1 (i.e., the dimension is doubled), the turned-on number of light emitting units per unit length PPI may decrease to half of the original one (PPI multiple changes from 1 to 0.5), thereby reducing the image quality, as shown by the line segment ABCD. In contrast, if there are assisting light emitting units 120 changing from the OFF mode to the ON mode in the stretching process, the turned-on number of light emitting units per unit length PPI may increase when the assisting light emitting units 120 are turned on, and then slowly decrease with stretching to the stretched state III to maintain the PPI multiple value as 1. In this design, the value of the turned-on number of light emitting units per unit length PPI may be maintained approximately equal before and after stretching, so as to provide more consistent image quality. According to some embodiments, the range of the multiple of the turned-on number of light emitting units per unit length PPI before and after stretching may be controlled between 0.5 and 1.5, that is, 1.5×PPI_1≥PPI_2≥0.5×PPI_1. Similarly, when stretching in two dimensional directions, the range of the turned-on number of light emitting units per unit area PPA before and after stretching should be controlled between 0.5 and 1.5, that is, 1.5×PPA_1≥PPA_2≥0.5×PPA_1, so as to maintain the image quality before and after stretching.

When the number of light emitting units 120 in the ON mode changes, it may affect the display image, such as generating a sense of difference. According to some embodiments, in order to reduce the sense of difference of the display image, a suitable threshold dimension may be designed. The setting of the threshold dimension is discussed below. Please refer to FIG. 6, for example, in the state that the length is 2X, the number of light emitting units 120 in the ON mode in the light emitting group 122 are increased. For example, the number is increased to 2. Therefore, in the state that the length is 2X, the PPI is 2/2X, so PPI multiple is also equal to 1, as shown at the point H in FIG. 6. When the time point that the number of light emitting units 120 in the ON mode starts to change is earlier, that is, when the threshold dimension Lc1 is very small or close to the non-stretched dimension X, the curve of the turned-on number of light emitting units per unit length PPI multiple to the dimension (PPI-dimension Curve) may be, for example, a line segment AEFGH, and the slope of the curve changes greatly in the interval DP1, which makes the sense of difference of the display image great. In contrast, when the time point that the number of light emitting units 120 in the ON mode starts to change is later, that is, when the threshold dimension Lc1 is very large or close to the stretched dimension 2X, the curve of the turned-on number of light emitting units per unit length PPI multiple to the dimension may be, for example, a line segment ABCDH, wherein the multiple of the turned-on number of light emitting units per unit length PPI is low before the point D of the interval DP2, so that the image quality is poor. Considering comprehensively the influence of the time point when the number of the light emitting units 120 in the ON mode starts to change on the sense of difference of the stretched image and the influence of the turned-on number of light emitting units per unit length PPI on the image quality, and considering that the range of the turned-on number of light emitting units per unit length PPI before and after stretching should be controlled between 0.5 and 1.5, the threshold dimension may be set in the interval range between the stretching increase unit corresponding to the point F (i.e., the curve is a line segment ABFGH) and the point G (i.e., the curve is a line segment ABCGH), that is, the interval DP3. Thus, the change amount of the slope of the curve may be small, and the turned-on number of light emitting units per unit length PPI in the transition state II may be greater than or equal to the first turned-on number of light emitting units per unit length PPI_I of in the non-stretched state I, so that the sense of difference of the display image during stretching is small and the image quality is high. In detail, in the line segment ABFGH, the assisting light emitting units 120 may change from the OFF mode to the ON mode when the multiple increased by stretching is ⅓ (or the stretching dimension increases by 42X/128). In the line segment ABCGH, the assisting light emitting units 120 may change from the OFF mode to the ON mode when the multiple increased by stretching is ½ (or the stretching dimension increases by 64X/128). Therefore, the range of the threshold dimension Lc1 may be designed within the interval that the length is stretched and increased by 0.33 times to 0.5 times (i.e., the dimension is within the interval between 1.33X to 1.5X), that is, $1.33\times \leq Lc1 \leq 1.5\times$. Thus, the sense of difference of the stretched image is small and the image quality is high.

Figure 7:
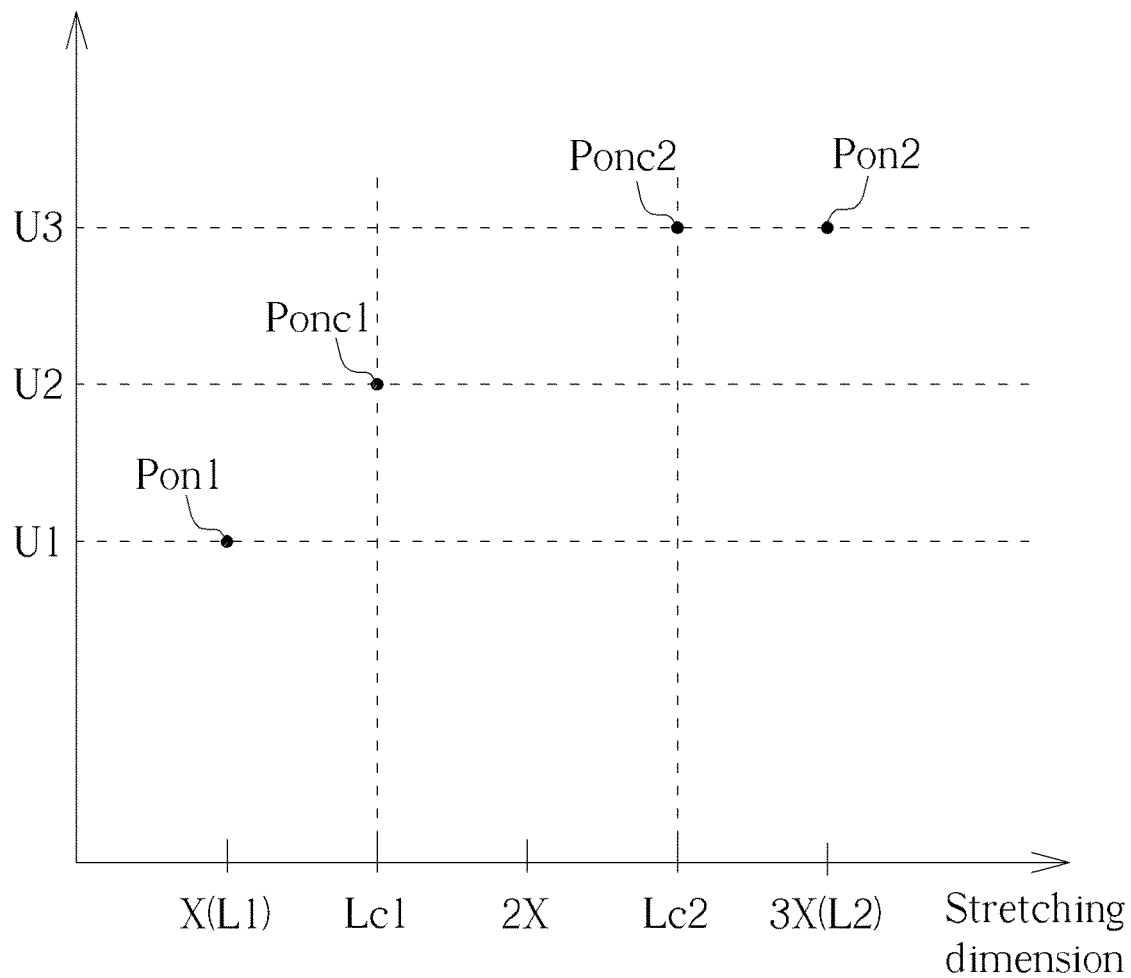
FIG. 7 is a schematic diagram of the relationship between the number of light emitting units being in the mode of ON and the stretching dimension in the light emitting group according to a fourth embodiment of the present disclosure.
Figure 8:
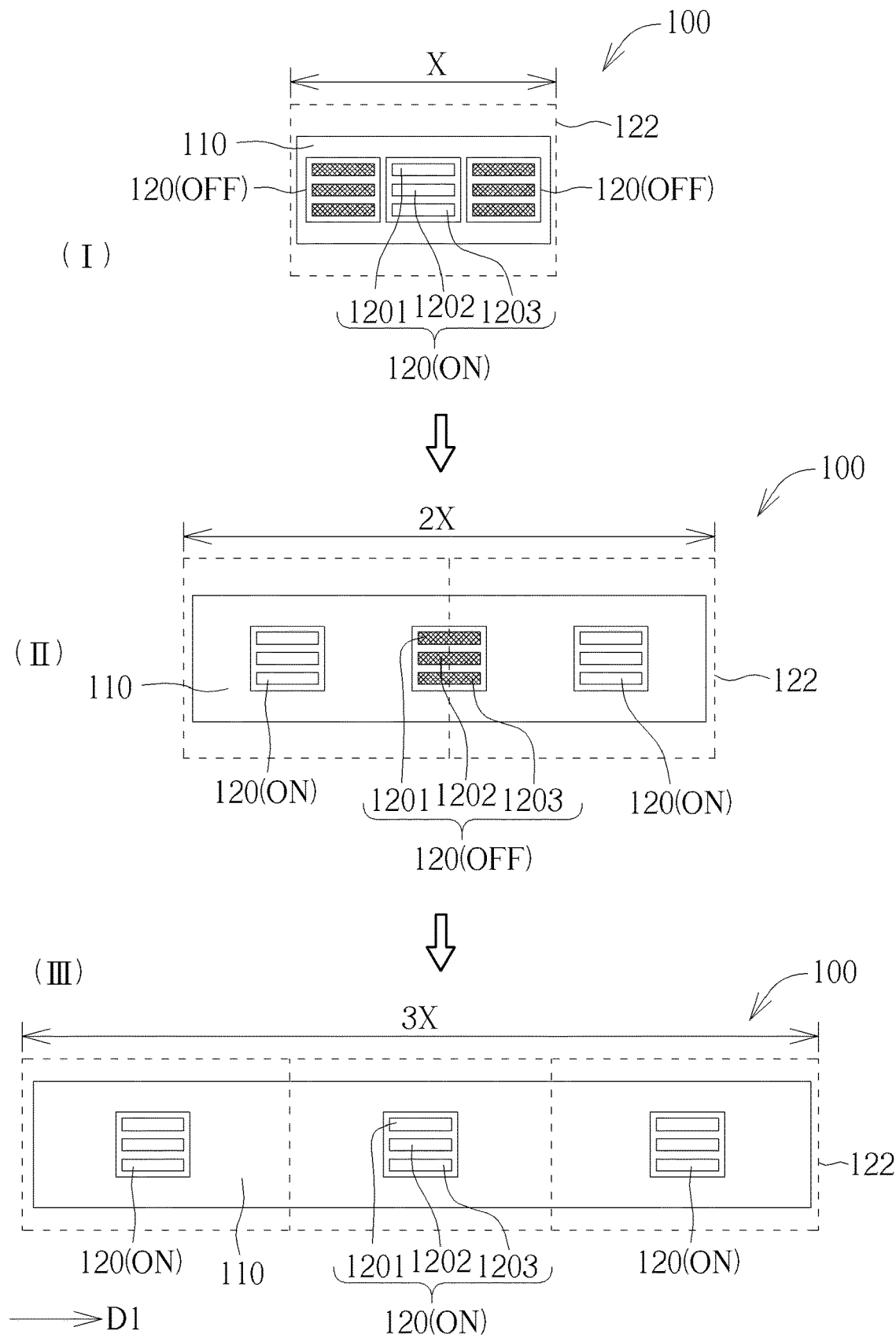
FIG. 8 is a partial schematic diagram of a stretchable display device in various states according to the fourth embodiment of the present disclosure.

Please refer to FIG. 7 and FIG. 8. FIG. 7 is a schematic diagram of the relationship between the number of light emitting units being in the mode of ON and the stretching dimension in the light emitting group according to a fourth embodiment of the present disclosure. FIG. 8 is a partial schematic diagram of a stretchable display device in various states according to the fourth embodiment of the present disclosure. In some embodiments, the stretchable display device 100 includes a plurality of light emitting units 120, one light emitting group 122 includes three light emitting units 120, and the stretchable substrate 110 may be stretched to three times the length. FIG. 8 only shows one light emitting group 122 as an example, but the present disclosure is not limited herein. In other embodiments, one light emitting group 122 may include other numbers of light emitting units 120. In some embodiments, each of the light emitting units 120 may include a plurality of sub-pixels or a plurality of light emitting elements. For example, one light emitting unit 120 includes three light emitting elements 1201, 1202 and 1203 side by side, which may represent three sub-pixels respectively, such as (but not limited to) a red sub-pixel, a green sub-pixel and a blue sub-pixel. When the stretchable display device 100 is in the non-stretched state I, the stretchable substrate 110 has a first dimension L1 (the horizontal coordinate is X), and the number of the light emitting units 120 in the ON mode in each of the light emitting groups 122 is U1, and the number U1 is 1 for example. When the stretchable substrate 110 is stretched to the stretched state III along the horizontal first direction D1, the stretchable substrate 110 has a second dimension L2 (the horizontal coordinate is 3X, and the stretching dimension is increased by two times), that is, it is stretched from one time the length X of the original dimension to three times the length 3X, and the number of the light emitting units 120 in the ON mode in each of the light emitting groups 122 is U3, and the number U3 is 3 for example. In the stretching process, a transition state II exists between the non-stretched state I and the stretched state III, wherein the assisting light emitting units 120 may change from the OFF mode to the ON mode respectively when the stretchable substrate 110 has the first threshold dimension Lc1 and the second threshold dimension Lc2. In detail, when the stretchable substrate 110 is stretched to have the first threshold dimension Lc1, the number of the light emitting units 120 in the ON mode in each of the light emitting groups 122 is U2, and the number U2 is 2 for example. Precisely speaking, a second light emitting unit 120 may change from the OFF mode to the ON mode (i.e. in one light emitting group 122, two light emitting units 120 are in the ON mode and the other one light emitting unit 120 is in the OFF mode). According to some embodiments, when the range of the first threshold dimension Lc1 is within the interval that the length is stretched and increased by 0.33 times to 0.5 times, that is, $1.33\times \leq Lc1 \leq 1.5\times$, the sense of difference of the stretched image may be small and the image quality may be high. When the stretchable substrate 110 is stretched to have the second threshold dimension Lc2, the number of the light emitting units 120 in the ON mode in each of the light emitting groups 122 is U3, and the number U3 is 3 for example, wherein U3>U2>U1. In detail, the third light emitting unit 120 of each of the light emitting groups 122 may change from the OFF mode to the ON mode (i.e., all of the three light emitting units 120 in one light emitting group 122 are in the ON mode). According to some embodiments, when the range of the second threshold dimension Lc2 is within the interval that the length is stretched and increased by 1.33 times to 1.5 times, that is, $2.33\times \leq Lc2 \leq 2.5\times$, the sense of difference of the stretched image may be small and the image quality may be high.

From the embodiments describe above, the rules of designing the threshold dimension in some embodiments of the present disclosure may be summarized as follows. For example, in some embodiments, the stretchable display device 100 includes a plurality of light emitting units 120, wherein a number Q of light emitting units 120 form a group to form a plurality of light emitting groups 122, and the stretchable substrate 110 may be stretched to m times the length (i.e., the length is increased by m−1 times). When the stretchable display device 100 is in the non-stretched state I, the stretchable substrate 110 has a first dimension L1, and one light emitting unit 120 is in the ON mode in each of the light emitting groups 122. When the stretchable substrate 110 is stretched along the horizontal first direction D1 to m times the length to make the stretchable display device 100 be in the stretched state III, the stretchable substrate 110 has a second dimension L2, and the number of the light emitting units 120 in the ON mode in each of the light emitting groups 122 is Q. In the stretching process, a transition state II exists between the non-stretched state I and the stretched state III. The stretchable substrate 110 may have a threshold dimension $Lc_{(Q-1)}$, which means that before the stretchable substrate 110 is stretched to the threshold dimension $Lc_{(Q-1)}$, only Q−1 light-emitting units 120 in one light emitting group are in the ON mode, and one light emitting unit 120 in one light emitting group is in the OFF mode. Furthermore, when the stretchable substrate 110 is stretched to the threshold dimension $Lc_{(Q-1)}$, the $Q^{th}$ light emitting unit 120 (i.e., the last one light emitting unit 120 that has not been turned on) may change from the OFF mode to the ON mode. From the above description, the range of the threshold dimension $Lc_{(Qc-1)}$ may be set within the interval that the stretching length is increased by (Q−2)+0.33 times to (Q−2)+0.5 times, that is, when (Q−2)+0.33≤the stretching multiple corresponding to $Lc_{Q-1} \leq (Q-2)+0.5$ or $((Q-1)+0.33)\times L1 \leq Lc_{Q-1} \leq ((Q-1)+0.5)\times L1$, the sense of difference of the stretched image may be small and the image quality may be high. For example, specifically, as shown in FIG. 7 and FIG. 8, Q=3, and the range of $Lc_{(Q-1)}$ (i.e., the second threshold dimension Lc2) may be designed as between [(Q−2)+1+0.33] times and [(Q−2)+1+0.5] times of the first dimension L1 in the non-stretched state, that is, between 2.33×L1 and 2.5×L1.

Please refer to FIG. 8. The change of turned-on positions of the light emitting units 120 from the non-stretched state I through the transition state II to the stretched state III is introduced below. In the non-stretched state I, one light emitting unit 120 in the light emitting group 122 is in the in mode ON. For example, the light emitting unit 120 in the middle is in the ON mode, and the light emitting units 120 on two sides are in the OFF mode. In the transition state II during the stretching process, when the stretchable substrate 110 is stretched to the first threshold dimension Lc1, one light emitting unit 120 that is turned on may be increased in the light-emitting unit group 122. For example, the second light emitting unit 120 in the light emitting group 122 may change from the OFF mode to the ON mode. At this time, it can be designed to change the light emitting unit 120 disposed in the middle from the ON mode to the OFF mode, and change the two light emitting units 120 disposed on two sides from the OFF mode to the ON mode, so as to obtain uniform image quality. Furthermore, when the stretchable substrate 110 is stretched to the second threshold dimension Lc2 or enters the stretched state III, all of the three light emitting units 120 in the light emitting group 122 are in the ON mode, that is, the middle light emitting unit 120 in the light emitting group 122 is also turned on. From the above description, in the stretching process, the light emitting units 120 that are turned on may be changed when stretching to the threshold dimension and requiring turning on the assisting number of light emitting units 120. For example, the light emitting units 120 that are turned on may be changed according to the disposing position of each of the light emitting units 120 in the light emitting group 122, so that the distribution position of the turned-on light emitting units 120 may be even, so as to make the image brightness uniform and improve the image quality. For example, when stretching to the threshold dimension, the light emitting units 120 that were originally turned on may be turned off and meanwhile other light emitting units 120 that were not originally turned on may be turned on, so that the positions of the turned-on light emitting units 120 are even, and the brightness is uniform.

Figure 9:
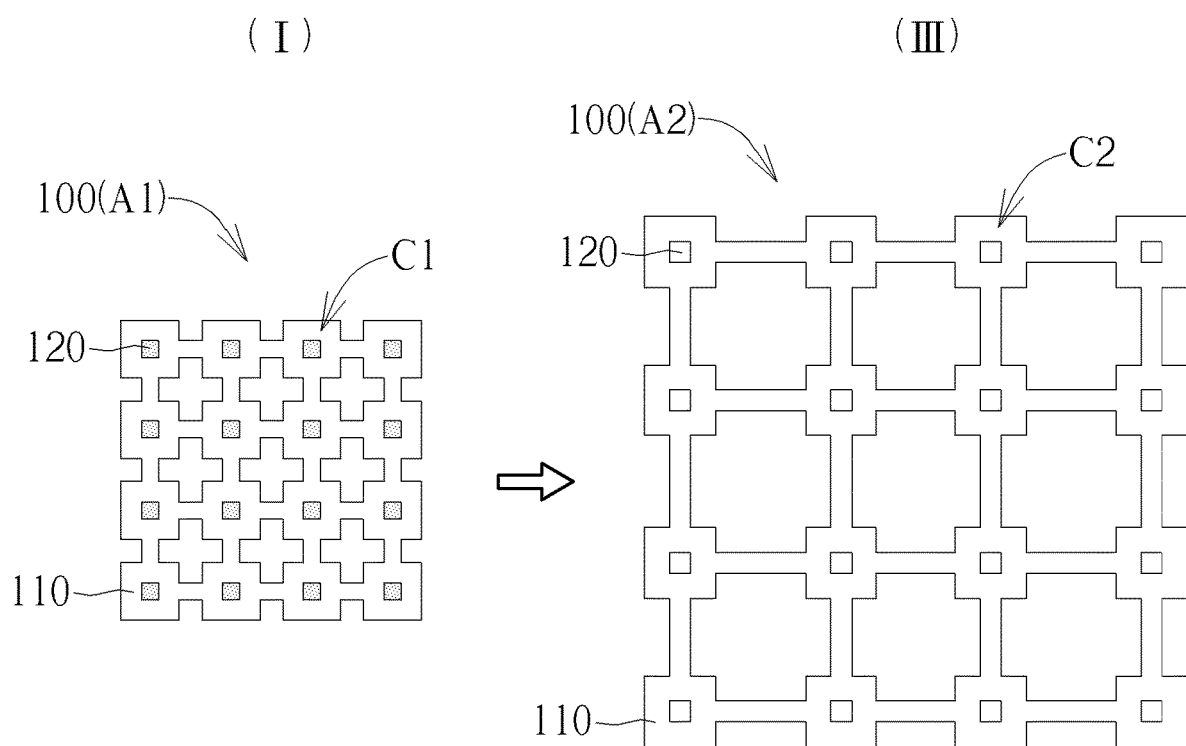
FIG. 9 is a schematic diagram of a stretchable display device in various states according to a fifth embodiment of the present disclosure.

Please refer to FIG. 9. FIG. 9 is a schematic diagram of a stretchable display device in various states according to a fifth embodiment of the present disclosure. In some embodiments, the overall brightness (candela/dimension$^2$) of the image may also be adjusted or maintained by providing different voltages or currents before and after stretching. For example, when the stretchable display device 100 is in the non-stretched state I, the stretchable display device 100 has a first area A1, and the plurality of the light emitting units 120 have a first brightness C1. After stretching, when the stretchable display device 100 is in the stretched state III, the stretchable display device 100 has a second area A2, and the plurality of the light emitting units 120 have a second brightness C2, wherein the second area A2 is greater than the first area A1, and the second brightness C2 is greater than the first brightness C1. By increasing the brightness of the light emitting unit 120, after the stretchable display device 100 is stretched and the area thereof is changed, the overall image may be maintained to have substantially identical brightness per unit area before and after stretching. The above-described method of adjusting the light emitting units 120 may be, for example, increasing the brightness of the light emitting elements by increasing the supply voltage or current thereof. In other embodiments, the overall brightness of the image before and after stretching may also be adjusted or maintained through changing the plurality of the light emitting units 120 from the OFF mode to the ON mode by regions. For example, when the stretchable display device 100 is in the non-stretched state I, the stretchable display device 100 has a first area A1, and only the light emitting units 120 in a few regions among the plurality of the light emitting units 120 are in the ON mode. After stretching, when the stretchable display device 100 is in the stretched state III, the stretchable display device 100 has a second area A2, and the light emitting units 120 in more or all regions among the plurality of the light emitting units 120 may all be in the ON mode, so as to maintain overall image with equal brightness before and after stretching, but not limited herein.

In some embodiments, when there is no need to display the image during the stretching process (i.e., in the transition state II), the image may not be displayed during the stretching process, and the image may be displayed after the stretching is completed to enter the stretched state III. For example, the stretchable display device 100 includes a plurality of light emitting units 120, wherein a number of Q of light emitting units 120 form a group to form a plurality of light emitting groups 122. When the stretchable display device 100 is in the non-stretched state I, the stretchable display device 100 has a first area A1, and the number of the light emitting units 120 being in the ON mode per unit area of the stretchable substrate 110 that is not stretched is defined as a first turned-on number of light emitting units per unit area PPA_1. After stretching, when the stretchable display device 100 is in the stretched state III, the stretchable display device 100 has a second area A2, and the number of the light emitting units 120 being in the ON mode per unit area of the stretchable substrate 110 that is stretched is defined as a second turned-on number of light emitting units per unit area PPA_2, wherein the second area A2 is different from the first area A1. For example, the second area A2 is greater than the first area A1, but not limited herein. Furthermore, the first turned-on number of light emitting units per unit area PPA_1 is equal to the second turned-on number of light emitting units per unit area PPA_2. During the stretching process, that is, in the transition state II, when the ratio of the second area A2 in the stretched state III to the first area A1 in the non-stretched state I divided by Q is not an integer (i.e., (A2/A1)/Q is not an integer), the image may not be displayed. When (A2/A1)/Q is an integer, the image may be displayed, and at this time the turned-on number of light emitting units per unit area (PPA) or the turned-on number of the turned-on number of light emitting units per unit length (PPI) may be maintained substantially the same. Alternatively, until the stretching is completed, i.e., when the stretched state III is reached, or when the first turned-on number of light emitting units per unit area PPA_1 is equal to the second turned-on number of light emitting units per unit area PPA_2, the image is displayed. Thus, the image is discontinuous during the stretching process.

According to some embodiments of the present disclosure, when the stretchable display device is in the non-stretched state, the transition state and the stretched state, the number of the light emitting units in the mode of ON may change, so the image quality during the stretching process may be adjusted. According to some embodiments, the display image of the stretchable display device in the stretched state and the non-stretched state may maintain substantially the same turned-on number of light emitting units per unit area, turned-on number of light emitting units per unit dimension/length and/or brightness per unit area, and this design, for example, may mitigate the deterioration of the image quality after stretching. In addition, according to some embodiments, designing suitable threshold dimensions may make the sense of difference of the stretched image small and improve the variability of the display image in the stretching process.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A stretchable display device, which is able to be operated with three states of a non-stretched state, a transition state and a stretched state, wherein the non-stretched state is a state that the stretchable display device is not stretched, the stretched state is a state after the stretchable display device is stretched, and the transition state is a state between the non-stretched state and the stretched state during a stretching process of the stretchable display device, the stretchable display device comprising:
 a stretchable substrate; and
 a plurality of light emitting units disposed on the stretchable substrate, wherein the plurality of the light emitting units can be in a mode of ON or in a mode of OFF,
 the light emitting units being in the mode of ON in a number of N1 while in the non-stretched state,
 the light emitting units being in the mode of ON in a number of N2 while in the transition state, and
 the light emitting units being in the mode of ON in a number of N3 while in the stretched state;
 wherein N3≥N2>N1.

2. The stretchable display device of claim 1, having a PPA_1 that is defined as a number of the plurality of the light emitting units being in the mode of ON per unit area of the stretchable substrate while in the non-stretched state, and a PPA_2 that is defined as a number of the plurality of the light emitting units being in the mode of ON per unit area of the stretchable substrate while in the stretched state, wherein the PPA_2 is equal to the PPA_1.

3. The stretchable display device of claim 1, wherein all of the plurality of the light emitting units are in the mode of ON while in the stretched state.

4. The stretchable display device of claim 1, wherein only a portion of the plurality of the light emitting units are in the mode of ON while in the stretched state.

5. A stretchable display device, which is able to be operated with three states of a non-stretched state, a transition state and a stretched state, wherein the non-stretched state is a state that the stretchable display device is not stretched, the stretched state is a state after the stretchable display device is stretched, and the transition state is a state between the non-stretched state and the stretched state during a stretching process of the stretchable display device, the stretchable display device comprising:
 a stretchable substrate; and
 a plurality of light emitting units disposed on the stretchable substrate, wherein the plurality of the light emitting units can be in a mode of ON or in a mode of OFF,
 the light emitting units being in the mode of ON in a number of N1 while in the non-stretched state,
 the light emitting units being in the mode of ON in a number of N2 while in the transition state, and
 the light emitting units being in the mode of ON in a number of N3 while in the stretched state;
 wherein N3≥N2>N1, and
 wherein the stretchable display device has a PPA_1 that is defined as a number of the plurality of the light emitting units being in the mode of ON per unit area of the stretchable substrate while in the non-stretched state, and a PPA_2 that is defined as a number of the plurality of the light emitting units being in the mode of ON per unit area of the stretchable substrate while in the stretched state, wherein $1.5 \times PPA\_1 \geq PPA\_2 \geq 0.5 \times PPA\_1$.

6. The stretchable display device of claim 5, wherein the PPA_2 is equal to the PPA_1.

7. The stretchable display device of claim 5, wherein all of the plurality of the light emitting units are in the mode of ON while in the stretched state.

8. The stretchable display device of claim 5, wherein only a portion of the plurality of the light emitting units are in the mode of ON while in the stretched state.

* * * * *